United States Patent [19]
Shepp et al.

[11] Patent Number: 5,659,175
[45] Date of Patent: Aug. 19, 1997

[54] APPARATUS AND METHOD FOR TOMOGRAPHY OF MICROSCOPIC SAMPLES

[75] Inventors: Lawrence Allan Shepp, Piscataway; Peter C. Fishburn, Madison, both of N.J.; Peter Schwander, Zurich, Switzerland; Robert Joseph Vanderbei, Belle Mead, N.J.

[73] Assignee: Lucent Technologies Inc., Murray Hill, N.J.

[21] Appl. No.: 576,607

[22] Filed: Dec. 21, 1995

[51] Int. Cl.[6] .......................... H01J 37/26; G01N 23/04
[52] U.S. Cl. .............................. 250/311; 250/307
[58] Field of Search ...................... 250/311, 307

[56] References Cited

U.S. PATENT DOCUMENTS

| | | | |
|---|---|---|---|
| 5,227,630 | 7/1993 | Saldin et al. | 250/307 |
| 5,475,218 | 12/1995 | Kakibayashi et al. | 250/311 |
| 5,576,543 | 11/1996 | Dingley | 250/311 |

OTHER PUBLICATIONS

Schwander et al., Mapping Projected Potential . . . , Physical Review Letters, vol. 71, No. 25, pp. 4150–4153 Dec. 1993.

*Primary Examiner*—Jack I. Berman

[57] ABSTRACT

A type of tomography is described, wherein occupancy of lattice sites in a microscopic sample of crystalline material is predicted. An electron beam is projected through the sample, at a specific angle, causing discernible spots in a detector, such as photographic film. Each spot corresponds to a row of atoms. The intensity of each spot indicates the number of atoms in the row, and the number is called a "line count." Projecting the electron beam at specific additional angles produces additional line counts. From all the line counts, a set of equations is derived. Each variable in the equations corresponds to a lattice site in the material. A solution to the equations is found by linear programming techniques, thus assigning a value to each variable. Each value indicates the probability of occupancy of a respective lattice site.

17 Claims, 13 Drawing Sheets

SECOND PHANTOM

RECONSTRUCTION

FIRST PHANTOM

RECONSTRUCTION

RECONSTRUCTION

THIRD PHANTOM

APPARATUS AND METHOD FOR TOMOGRAPHY OF MICROSCOPIC SAMPLES

The invention concerns microscopic tomography, wherein probabilities of occupancy of individual lattice sites within a crystal are estimated. The invention has application in the examination of the internal structure of semiconductors, wherein occupancy of lattice sites is desired to be known.

BACKGROUND OF THE INVENTION

At least two types of radiography exist, namely, projection radiography and tomographic radiography. The term "radiography" generically refers to the use of "radiation" to produce a "graph," or picture, of an object.

In projection radiography, such as that which produces a common X-ray photograph, an object is immersed in a beam of radiation. The radiation passes through the object, and onto photographic film, or other detector. Since the object, in general, is non-uniform in density, the different rays of radiation, within the beam, will be attenuated differently as they pass through the object.

The rays which are attenuated a small amount produce bright spots on the film. The rays which are attenuated a large amount produce dark spots on the film. (Of course, an opposite type of photographic film can be used, wherein bright spots correspond to large attenuation, and dark spots correspond to small attenuation.)

The collection of bright and dark spots on the film forms an image. Each spot indicates the overall density of the path, through the object, taken by its respective ray.

In tomographic radiography, projection radiography is done, but repeated many times. The repetitions produce a collection of data which is used to generate an image of the cross section of the object. That is, multiple "side views" of the object are used to generate a "cross sectional view," called a phantom. FIG. 1 illustrates, in simplified form, some basic principles of tomography.

The object 3 of FIG. 1A is conceptually divided into pixels P, as in FIG. 1B. Each ray R of radiation passing through the body is attenuated by the sequence of pixels through which it passes. A collection of parallel rays, spanning from point C to point D, produces one of the projection images.

The amount of attenuation of each ray is measured, using a detector which produces numerical output. Then, an equation is derived for each ray. A simplified example is given by FIG. 1C.

If the initial intensity of the ray is $I_o$, and if the intensity of the ray after passing through the object is $I_f$, then Equation (1) is obtained for FIG. 1C:

$$I_f = [I_o e^{-\alpha_1 L_1}][e^{-\alpha_2 L_2}][e^{-\alpha_3 L_3}] \quad (1)$$

Each bracketed term in Equation (1) corresponds to a position indicated in FIG. 1C.

Equation 1 results from a single ray. Since multiple rays produce each image, multiple equations are obtained for each image. Further, since numerous images are obtained, numerous sets of equations, each containing multiple equations, are obtained.

The numerous sets, of multiple equations each, are solved for the variables α, three of which are found in Equation (1). Each α represents the attenuation coefficient of a pixel.

After a solution is obtained, the attenuation coefficient, α, for each pixel is mapped graphically, as by using darker colors for larger coefficients, and lighter colors for smaller coefficients. The map obtained is commonly called a "phantom." Since the attenuation coefficient of each pixel can be correlated with other physical parameters associated with the pixel, such as density (ie, mass per unit volume), the mapping indicates the density pattern (or other parameter) within the phantom.

This type of tomography is called "continuous domain" tomography, because the pixels represent a continuum, in the sense that there is no vacant space between pixels.

Radiation tomography cannot be used for very small objects. One reason is that the wavelength of the radiation used limits the resolving power of the tomography, just as the wavelength of light limits the resolving power of the optical microscope. In general, the wavelength must be "small," compared with the size of the pixels.

However, if the object is sufficiently small, the pixels will be even smaller (because they must be contained within the object) and tomography cannot be used, because the pixels will be smaller than the wavelength of the radiation.

Another reason is that, in general terms, the size of each pixel P in FIG. 1B approximately equals the size of the detector (not shown) used to detect each ray R. If the object under investigation is made arbitrarily small, then the pixels become even smaller. Detectors of arbitrarily small size are typically not available.

The invention performs tomography on extremely small objects, having cross-sectional sizes, for example, in the range of 100×100 atoms. The invention detects the presence and absence of individual atoms at lattice sites.

SUMMARY OF THE INVENTION

The invention concerns "discrete domain" tomography. That is, the invention seeks to ascertain the presence or absence of objects (such as atoms) at lattice sites. Since "presence" and "absence" can be represented by a single binary variable having the value of 0 or 1, the "domain" of the variable can be termed "discrete." In contrast, in continuous domain tomography, the variable α of Equation (1) can assume any positive value, consistent with the designation "continuous domain."

Because of the restricted values of α in discrete domain tomography, many fewer equations are required, as compared with continuous domain tomography. Consequently, a significant reduction in the required number of projections (ie, sets of rays) is attained. (All rays parallel to R1 in FIG. 1B represent one set of rays.)

For example, in continuous domain tomography, a hypothetical system of equations, containing a given number of variables, may require 300 or 400 projections to attain a solution. In contrast, under the invention, in the discrete domain, a similar system requires approximately 3 or 4 projections.

In one form of the invention, line counts are obtained from a lattice. (A "line count" is a count of the number of atoms in a specific row, or line.) A system of equations is derived from the line counts. A solution to the system is obtained. The solution process is constrained to provide only solutions in which the variables lie within a predetermined range, such as from zero to unity. In the solution, each variable corresponds to a lattice site, and the value of the variable is taken as the probability of occupancy of the site.

DETAILED DESCRIPTION OF THE INVENTION

Overview of Invention

The invention first obtains "line counts" of atoms. A line count is a "count" of atoms in a "line." For example, in FIG. 7A, the count of atoms in column C1 (which is a line) is five. This line count produces the following equation:

$$x_{11}+x_{21}+x_{31}+x_{41}+x_{51}+x_{61}=\text{line count}=5$$

In the equations, a value of "1" for an "x" indicates the presence of an atom; a value of "0" indicates absence.

A system of multiple equations is obtained, by obtaining multiple line counts. The system of equations is then solved, using linear programming techniques. When the equations are solved, the values of the "x's" become known. These values are treated as probabilities. Since the subscript of each "x" indicates a specific lattice site, the probability of occupancy of each lattice site becomes known.

Detailed Discussion

The discussion contained herein can, conceptually, be divided into two parts. One part concerns obtaining line counts. The other part concerns setting up equations, based on the line counts, and solving them.

Line Counts

The discussion regarding line counts is simplified, in order to set forth basic principles necessary for an understanding overall operation of the invention. Detailed procedures for obtaining line counts are known in the art. One procedure is described in "Mapping Projected Potential, Interfacial Roughness, and Composition in General Crystalline Solids by Quantitative Electron Microscopy," by P. Schwander, C. Kisielowski, M. Seibt, F. H. Baumann, Y. Kim, and A. Ourmazd, Phys. Rev. Lett., 71, pp 4150–4153 (1993). This article is hereby incorporated by reference.

This discussion will first set forth some phenomena which have been observed, and which are used to produce the line counts. Then, this discussion will explain how these phenomena are used to implement microscopic tomography.

Figure 2:
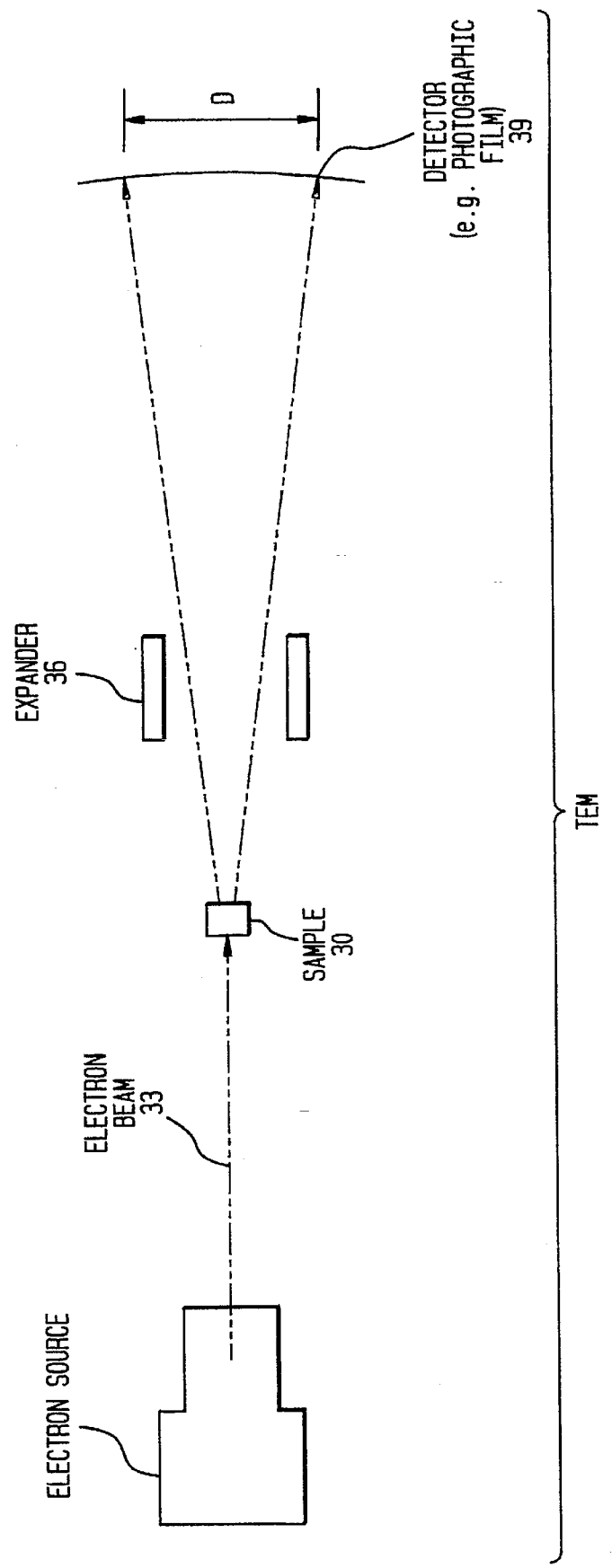
FIG. 2 illustrates use of a transmission electron microscope, TEM, to obtain line counts from a SAMPLE 30

A small SAMPLE 30 of a crystal in FIG. 2 was positioned within an ELECTRON BEAM 33 produced by a transmission electron microscope, TEM.

The TEM, in general, produces a beam of electrons, and transmits the beam through an object under study, which is the SAMPLE 30 in this case. A detector detects the beam, after transmission through the object, and variations in the detected beam allow inference of physical features of the object. The TEM resembles, in principle, an optical microscope, wherein light (analogous to the ELECTRON BEAM 33) is transmitted through an optically transparent object (analogous to the SAMPLE 30), and then an image is focused by an optical system, and detected by the human eye, or a camera. However, in the TEM, the electrons are of much shorter wavelength than light, allowing detection of smaller features than in the optical microscope.

The SAMPLE 30 measured approximately 100×100 atoms in cross section. In the simplest case, the SAMPLE 30 is modelled as a single layer of atoms, as in FIG. 3, and the ELECTRON BEAM 33 is modelled as a single sheet of electrons.

After the BEAM 33 in FIG. 2 passes through the SAMPLE 30, an EXPANDER 36 expands the BEAM 33. The expanded ELECTRON BEAM 33 then strikes a DETECTOR 39, such as a photographic film. The DETECTOR 39 is of macroscopic dimensions, as opposed to microscopic dimensions: distance D is visible to the human eye, as are the spots produced, such as spot 5A in FIG. 6, which is discussed later. To repeat, the BEAM 33 was expanded from a cross-section of microscopic dimension, at the SAMPLE 30, to macroscopic, visible dimensions, at the DETECTOR 39.

Figure 3:
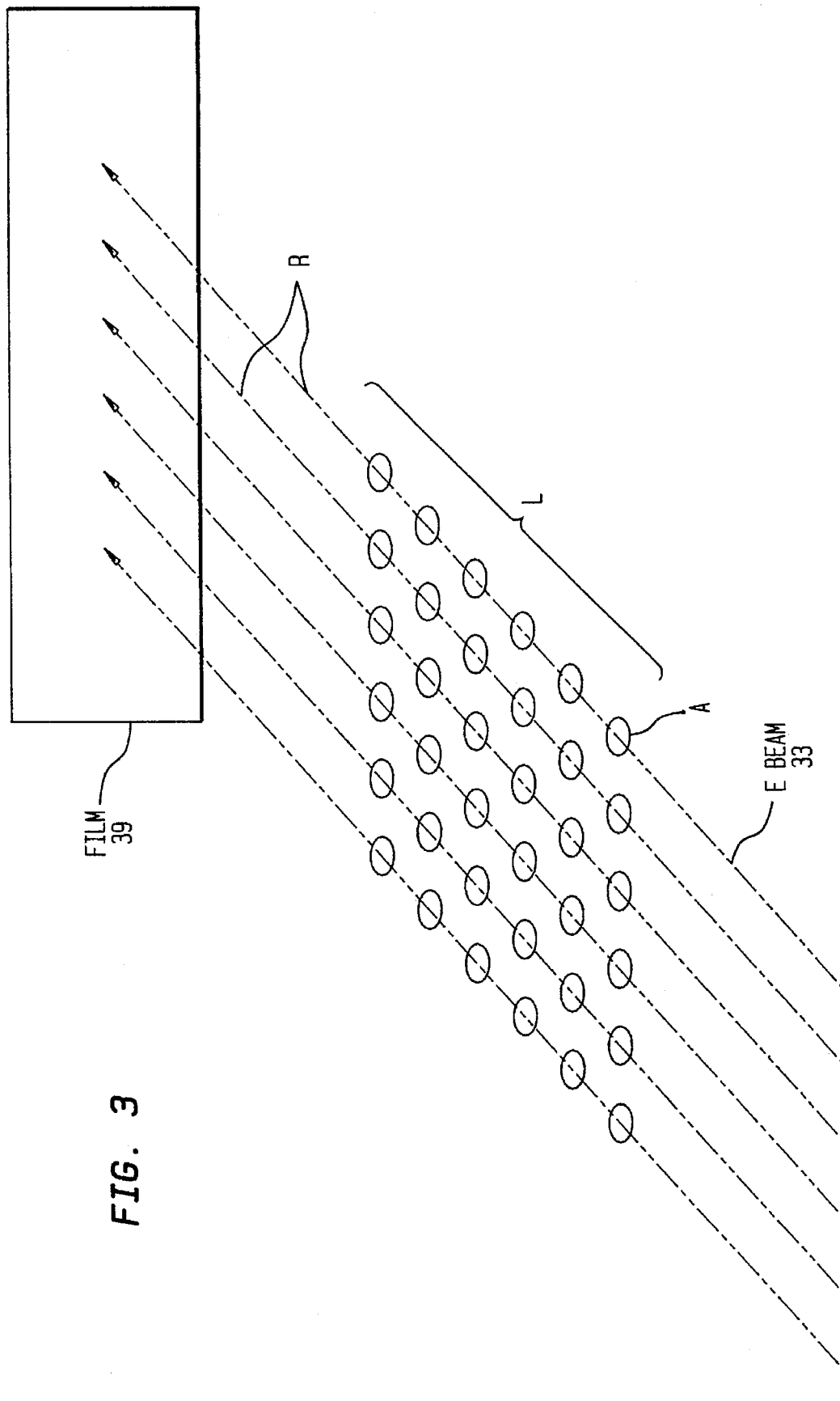
FIG. 3. illustrates passage of the ELECTRON BEAM 33 of FIG. 2 through a 6×6 lattice of atoms, en route to a DETECTOR 39 in the form of a photographic film.

The images produced on the FILM have been found to be consistent with a model in which the ELECTRON BEAM 33 is conceptually divided into rays R, indicated by the dashed arrows in FIG. 3. When each ray R travels along a column of atoms, as in FIG. 3, and encounters only electrons in the single column, and in no other columns, then the ray produces a spot having a brightness which is correlated with the number of atoms in the column.

Figure 4:
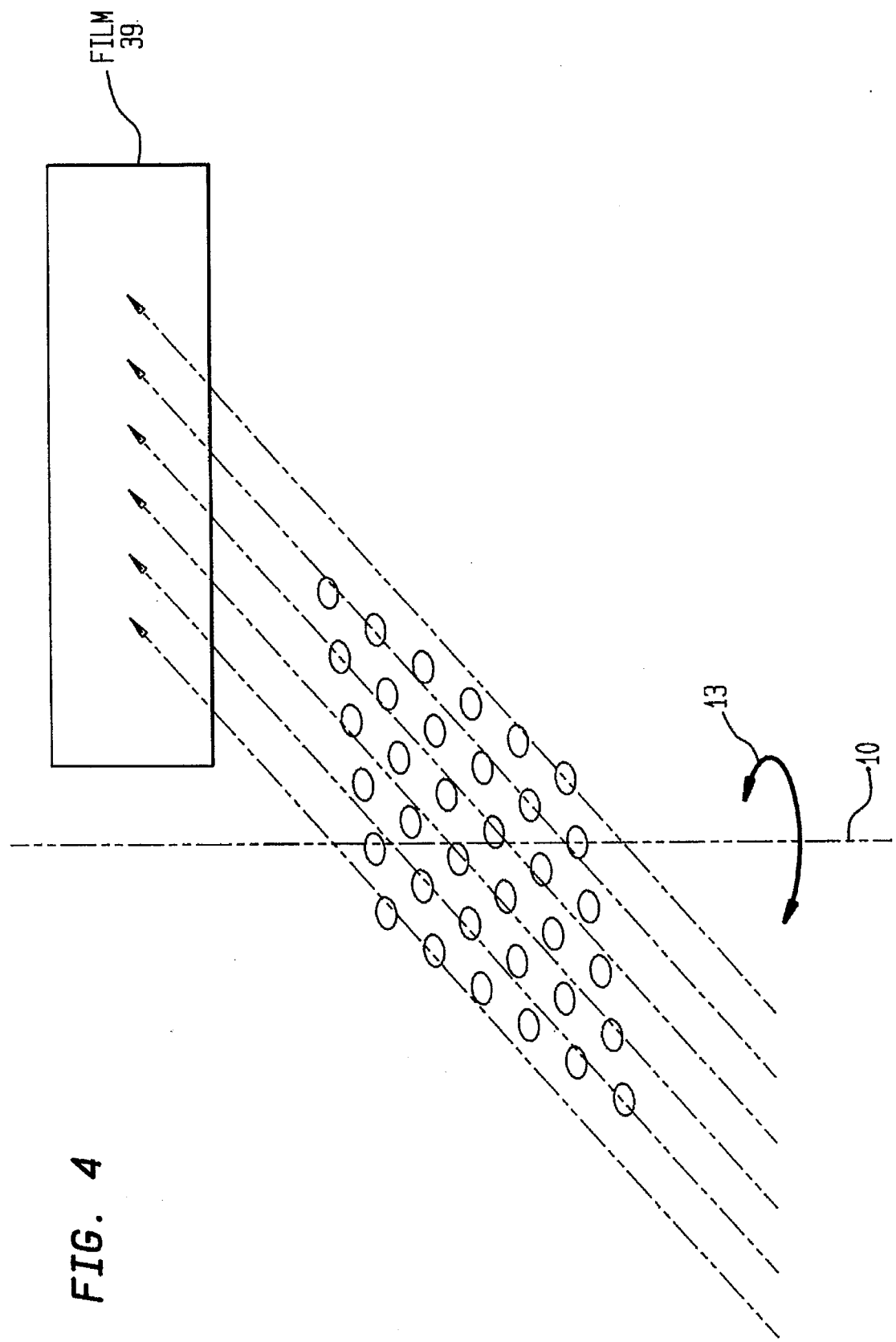
FIG. 4. illustrates the lattice of FIG. 3, but skewed so that electrons (indicated by the dashed arrows) pass through atoms located in more than one row, or line.
Figure 5:
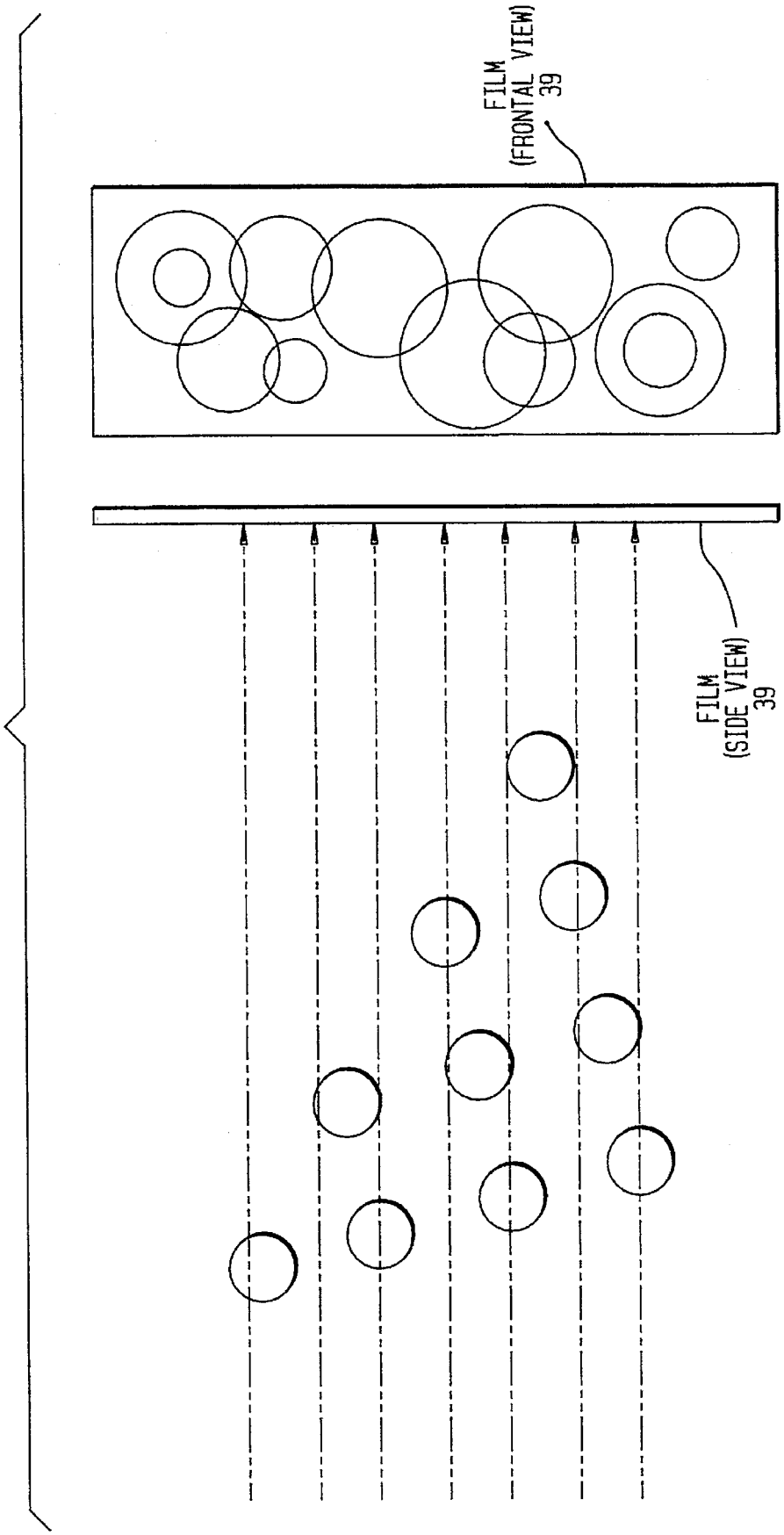
FIG. 5. illustrates, in simplified form, the situation of FIG. 4, and a simplified image which results on the FILM 39.

However, when a ray does not travel parallel to columns, but strikes atoms in different columns, as in FIG. 4, and in enlarged form in FIG. 5, the image produced is very complex, as indicated in FIG. 5, and does not directly indicate the atom content of a column.

Figure 6:
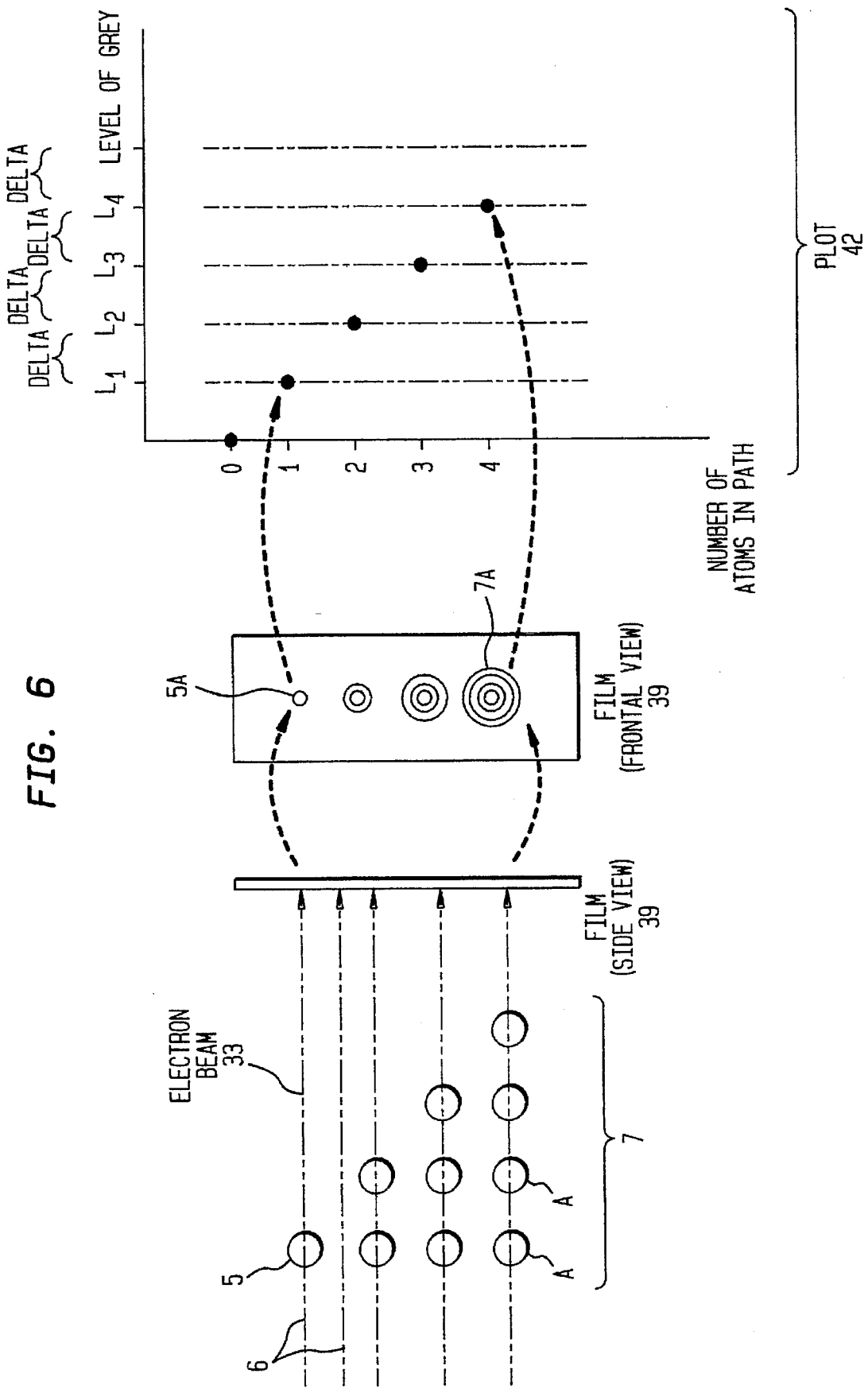
FIG. 6 illustrates how the amount of attenuation of the electron beam indicated by the brightness of spots such as 5A and 7A, indicates the line counts.

FIG. 6 gives a simplified model of correlation between the grey level of the spots produced, and numbers of atoms in columns. The circles at the left side of the FIG. indicate atoms A. The ELECTRON BEAM 33 passes through the atoms, and thence to the FILM 39. When the ELECTRON BEAM 33 passes through a single atom 5, a relatively faint spot 5A is produced on the FILM 39. When the BEAM 33 passes through four atoms, labeled 7, a much denser spot 7A is produced. For two and three atoms, the relative spot density is intermediate, as shown.

Ray 6 encountered no atoms, and produces no darkening of the film. The grey scale value of its "spot" is used as a reference, to indicate the grey scale of a non-attenuated ray, which encounters no atoms.

A grey scale can be illustrated by analogy to a color spectrum produced by a prism. However, in the grey scale, the spectrum ranges from dark grey (or black), through medium shades of grey, to very light grey (or white). An ascending sequence of numbers is assigned to the scale, so that the darkest grey may be assigned the number zero, the lightest grey may be assigned the number 63, and intermediate shades of grey will be assigned numbers accordingly, thereby giving 64 levels of grey.

(Whether the spot is dark on a light background, or light on a dark background, depends on the type of FILM 39, and its processing. In either case, a grey scale of spot density is obtained, wherein the relative degree of greyness of a spot indicates the relative number of atoms encountered by the part of the ELECTRON BEAM 33 producing the spot. For illustrative purposes, the discussion herein will assume that a non-attenuated ray produces a fully bright spot, and a fully attenuated ray produces a fully dark spot.)

The grey level of all spots is quantified and plotted, producing the PLOT 42 shown at the right side of the Figure. Quantification, and plotting, of grey-scale images is known in the art.

Three features of the PLOT 42 are particularly significant. One is that the spot densities are found to lie at discrete levels, labeled L1, L2, L3, and L4, corresponding to 1, 2, 3, and 4 atoms encountered, respectively. The second is that the discrete levels can be separated by a constant interval, labeled DELTA. The third (which may be a result of the second feature, or both the second and the first) is that the PLOT 42 can be made linear (although discrete), and of the form $$y = mx + b,$$

wherein y is the number of atoms, x is the grey scale value, m is the slope of the line (indicated by DELTA), and b is the y-intercept.

It is not necessary that DELTA be a constant interval. If DELTA is not constant, it is believed possible to ascertain the number of atoms, k, encountered by the electron beam, if each quantity "Lk" defines a unique "k." For example, if the quantities L1×k1, L2×k2, L3×k3, and L4×k4, are all different, then each "L" specifies a respective number of atoms (ie, the corresponding "k"), even if DELTA is not a constant. There is uncertainty as to whether all crystals (such as those of low atomic weight, as well as those of high atomic weight) will produce the linear PLOT 42 of FIG. 6. Exponential attenuation may be found in some cases. This issue is discussed in a later section. However, exponential attenuation, and other types, may be linearized, to form a linear plot of the form shown in FIG. 6. Consequently, linear plots will be analyzed herein, and taken as representative of the general case.

As stated above, discrete spots can be found, as well as more complex patterns, as in FIG. 5. Typically, discrete spots are the exception, rather than the rule. That is, discrete spots are obtained only when the SAMPLE 30 is positioned at certain rotational positions, analogous to the "principle" or "main" directions of X-ray crystallography. Restated, if the SAMPLE 30 is rotated about axis 10 in FIG. 4, as indicated by arrows 13, discrete spots are obtained only at very few, specific, angular positions.

The invention utilizes these correlations between (a) grey scale level and (b) number of atoms in a column, in performing tomography upon the SAMPLE 30. First, the SAMPLE 30 of FIG. 2 is mounted on a rotatable stage (not shown), to allow the rotation about axis 10 shown in FIG. 4. A 6×6 SAMPLE is shown in FIG. 4 for simplicity.

Figure 7C:
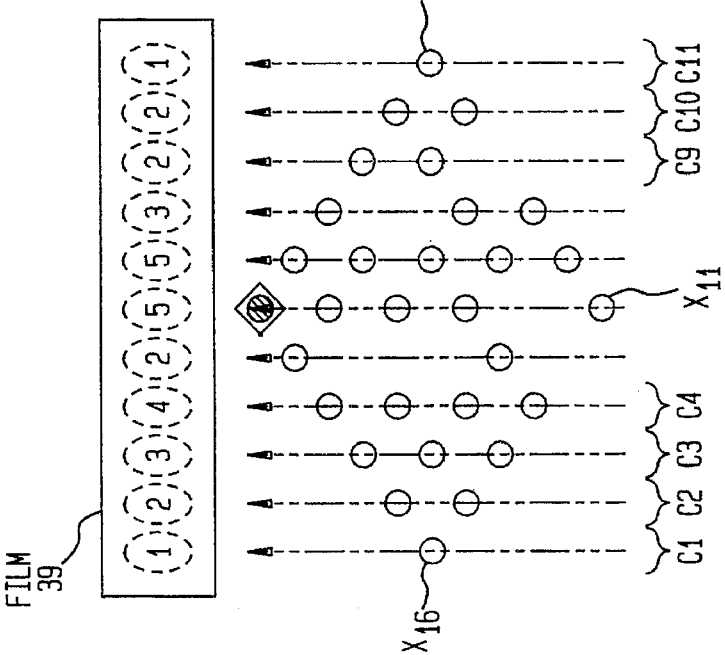
FIGS. 7A–7C illustrates taking of line-count data at three different positions.
Figure 7B:
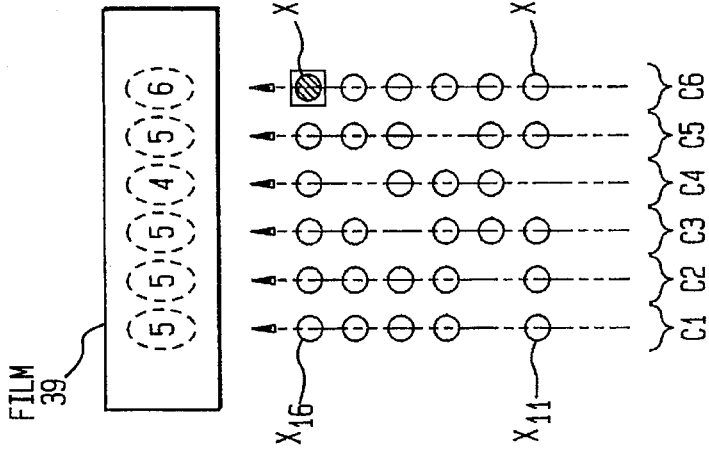
Figure 7A:
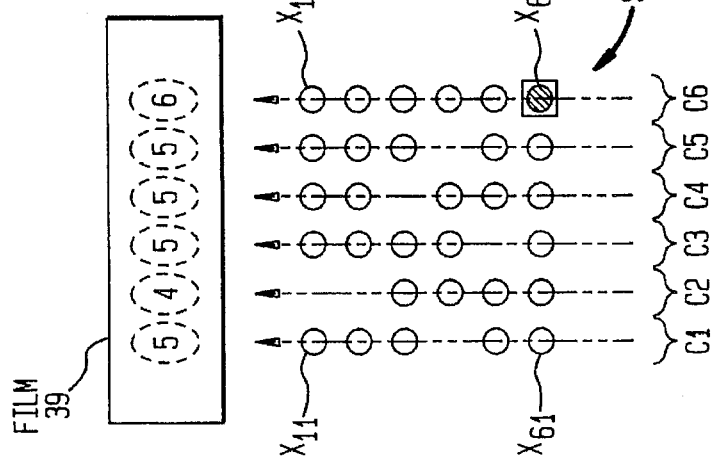

Next, the SAMPLE 30 must be positioned as shown in FIG. 7A, wherein the columns of atoms C1–C6 are aligned parallel to the electron beam, indicated by the dashed arrows. However, in general, the orientations of the crystal planes within the SAMPLE 30 with respect to the surfaces of the SAMPLE 30 will not be known. Thus, it will not be known a priori how to position the SAMPLE 30 in the configuration shown in FIG. 7A.

Consequently, after mounting the SAMPLE 30, the rotatable stage is rotated about axis 10 in FIG. 4, as indicated by arrows 13, until discrete spots are obtained on the FILM 39. When the spots are found, it is assumed that the SAMPLE 30 is positioned as shown in FIG. 7A (or in another key position).

Data is now taken. The number of spots is counted. The number of spots indicates the number of columns of atoms. Also, the grey level of each spot is recorded, together with the grey levels of the spaces between the spots (or of selected spaces).

In the present example, FIG. 7A illustrates six spots, each having a grey level indicated by the number within the spot. Specifically, the five atoms in column C1 produce the grey-scale image of intensity "5", as indicated. The four atoms in column C2 produce the image "4", and so on. Six data points are obtained from the six spots.

After recording the data, the crystal is rotated a precise amount, such as through 90 degrees. Such precise rotation may be difficult to achieve, due to factors such as machining errors in the rotatable stage. If so, a trial-and-error process, similar to that undertaken in reaching the position shown in FIG. 7A, can be used to find the proper position.

FIG. 7B indicates the new position. The atom labeled $x_{66}$ is shaded, and enclosed in a box, for reference, to show its position relative to its previous position in FIG. 7A. The number of spots, and grey level of each, is recorded.

Next, the SAMPLE 30 is rotated through 45 degrees, placing the SAMPLE 30 into the position shown in FIG. 7C. Again, the atoms are aligned on columns C1 through C11, which are parallel to the electron beam, indicated by the dashed arrows. The number of spots is counted (it will be eleven in FIG. 7C) and the grey level of each is recorded.

Equations and Their Solutions

The data indicated in FIG. 7 allows the following system of equations to be derived. From FIG. 7A, one obtains

| | |
|---|---|
| $X_{11} + X_{21} + X_{31} + X_{41} + X_{51} + X_{61} = 5$ | (Col. C1) |
| $X_{12} + X_{22} + X_{32} + X_{42} + X_{52} + X_{62} = 4$ | (Col. C2) |
| $X_{13} + X_{23} + X_{33} + X_{43} + X_{53} + X_{63} = 5$ | (Col. C3) |
| ... | |
| $X_{16} + X_{26} + X_{36} + X_{46} + X_{56} + X_{66} = 6$ | (Col. C6) |

The variables "x" will later, upon solution, indicate the presence, or absence, of atoms. When "x" is found to have a value ZERO, the ZERO indicates absence of an atom. In contrast, a ONE indicates the presence of an atom. The subscripts indicate the x-y position of the atom indicated by each "x".

The number on the right of each equation is a line count.

FIG. 7B produces the following equations:

| | |
|---|---|
| $X_{11} + X_{21} + X_{31} + X_{41} + X_{51} + X_{61} = 5$ | (Col. C1) |
| $X_{21} + X_{22} + X_{23} + X_{24} + X_{25} + X_{26} = 5$ | (Col. C2) |
| ... | |

FIG. 7C produces the following equations:

| | |
|---|---|
| $X_{11} = 1$ | (Col. C1) |
| $X_{15} + X_{26} = 2$ | (Col. C2) |
| $X_{14} + X_{25} + X_{36} = 3$ | (Col. C3) |
| $X_{13} + X_{24} + X_{35} + X_{46} = 4$ | (Col. C4) |
| ... | |
| $X_{51} + X_{62} = 2$ | (Col. C10) |
| $X_{61} = 1$ | (Col. C11) |

At this point, the system of equations contains 23 equations in 26 unknowns. Multiple solutions exist, because the number of unknowns exceeds the number of variables. However, because the x's assume only two values (zero and unity), it may be possible to determine the x's uniquely using fewer than 26 equations.

This remains true even under the weaker assumption (discussed later) that $0 \leftarrow x \leftarrow 1$, wherein x can assume the range of values between zero and unity. As shown in the publication "Sets Uniquely Determined by Projections on Axes II, Discrete Case," *Discrete Mathematics* 91, pp. 149–159 (1991), there are many cases where the constraints $0 \leftarrow x \leftarrow 1$ on the unknowns guarantee a unique solution.

In this particular example, taking further data, at additional positions, can cause the number of unknowns to equal the number of equations. However, in the general case, attaining this equality is not practical. For example, for a SAMPLE 30 of size 100×100 atoms, the number of variables is 10,000 (which corresponds to the total number of atoms). It is not practical to obtain and solve 10,000 equations, even assuming that 10,000 equations are available from the procedure outlined in FIG. 7.

The system of equations is solved using linear programming techniques. Linear programming is known in the art, and may be described generically as a systematic procedure for solving large systems of simultaneous linear equations. The system is solved, subject to the constraint that the variables "x" are limited to the range from ZERO and ONE. That is, fractional solutions are allowed for each "x." The significance of fractional solutions will be discussed later. This constrained problem may have a unique, or nearly unique, solution even though there may be many fewer equations than unknowns (see the Discrete Mathematics publication discussed above).

Two commercially available linear programming software packages are CPLEX, available from CPLEX, Inc., located in Incline Village, Nevada, and LOQO, available from Princeton University, Princeton, N.J.

As stated above, multiple solutions exist. It has been found that useful information can be deduced about the crystal structure by selecting a particular solution. That solution is the "most interior point solution," which is a term-of-art.

One definition of the most interior point solution is the following. The equations derived from FIG. 7, and given above, can be re-arranged to the following form:

$$Ax + b = 0$$

Wherein A is a matrix, and x and b are vectors. The most interior point solution chooses the solution (ie, a particular vector x) in which the following quantity is minimal:

$$-\Sigma_{ij} LOG(x_{ij}) \qquad (2)$$

For example, in the case of the equations obtained from FIG. 7, the index i in Equation 2 will run from 1 to 6, and index j will do likewise. In an actual sample of 100×100 atoms, the index i will run from 1 to 100, and index j will do likewise.

Figure 8:
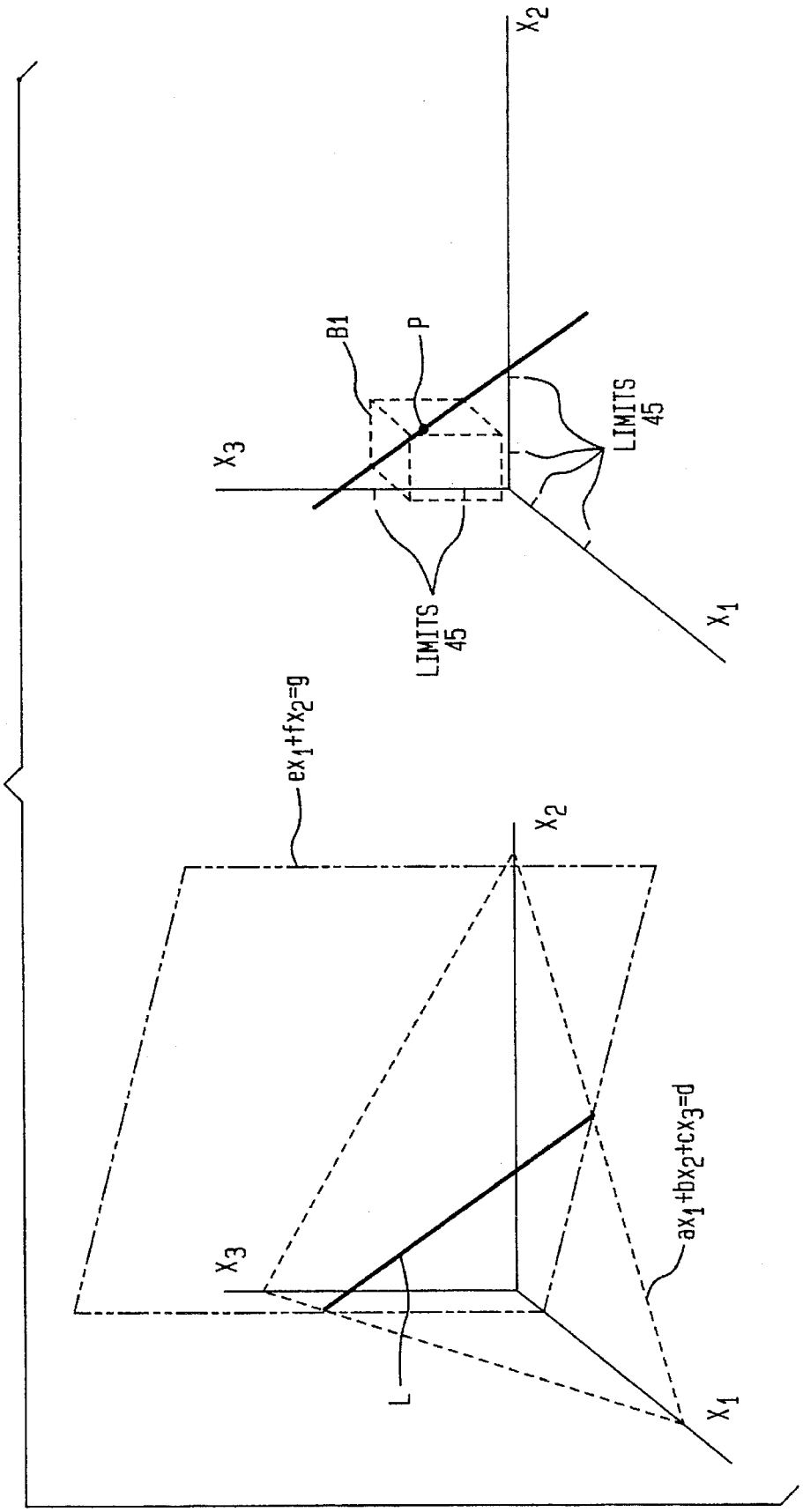
FIG. 8 illustrates graphically, in simplified form, the concept of "most interior point solution."

A simplified graphical illustration of the "maximal interior point" is given in FIG. 8. Assume that one equation is $$ax_1 + bx_2 + cx_3 = d$$

and another is $$ex_1 + fx_2 = g.$$

These equations represent two planes, which intersect along line L.

Applying constraints to the variables $x_1$, $x_2$, and $x_3$, indicated by the LIMITs 45, forces the solutions, on line L, to lie within the dashed box B1, shown on the right side of the FIG. Thus, the line segment on L, lying between the LIMITS, represents the allowed solutions.

The "most interior point" is a single point P, whose distance from the edges of the dashed box B1 is maximized by minimizing a prescribed function. Equation (2) above gives the preferred minimization function.

As another example, the six equations derived from FIG. 7A will intersect to form a four-dimensional figure (not shown), instead of the LINE in FIG. 8. The four-dimensional figure defines a space containing the possible solutions. The "most interior point" is a point within the figure defined by Equation (2), above.

Figure 9A:
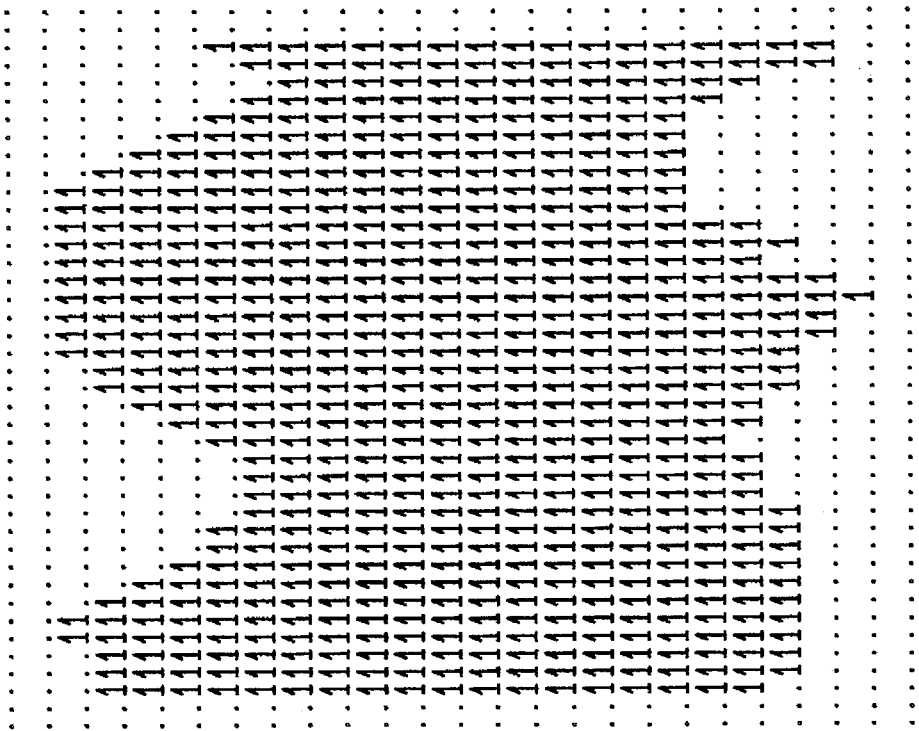
FIGS. 9A, 10A, and 11A illustrate hypothetical lattices.
Figure 9B:
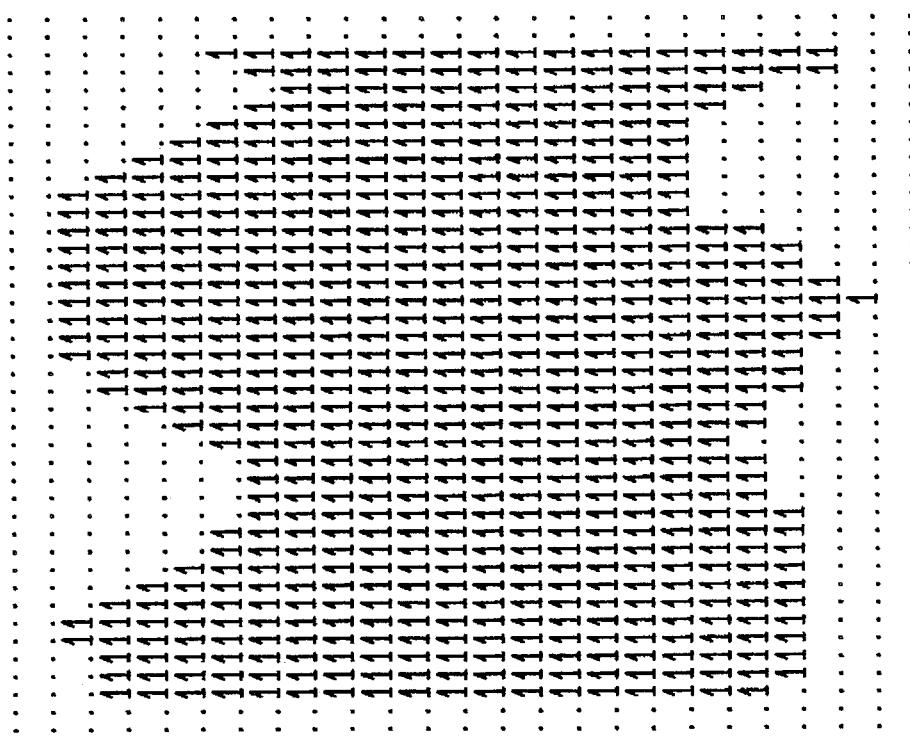
FIGS. 9B, 10B, and 11B illustrates phantoms produced by the invention for the lattices of FIGS. 9A, 10A, and 11A, respectively.
Figure 10A:
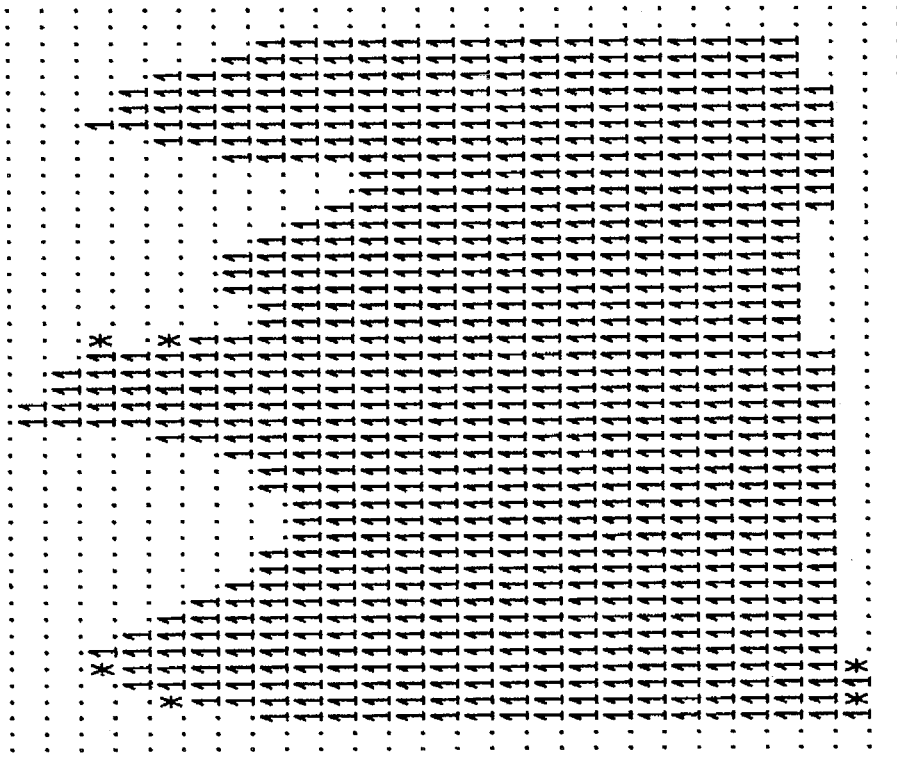
Figure 10B:
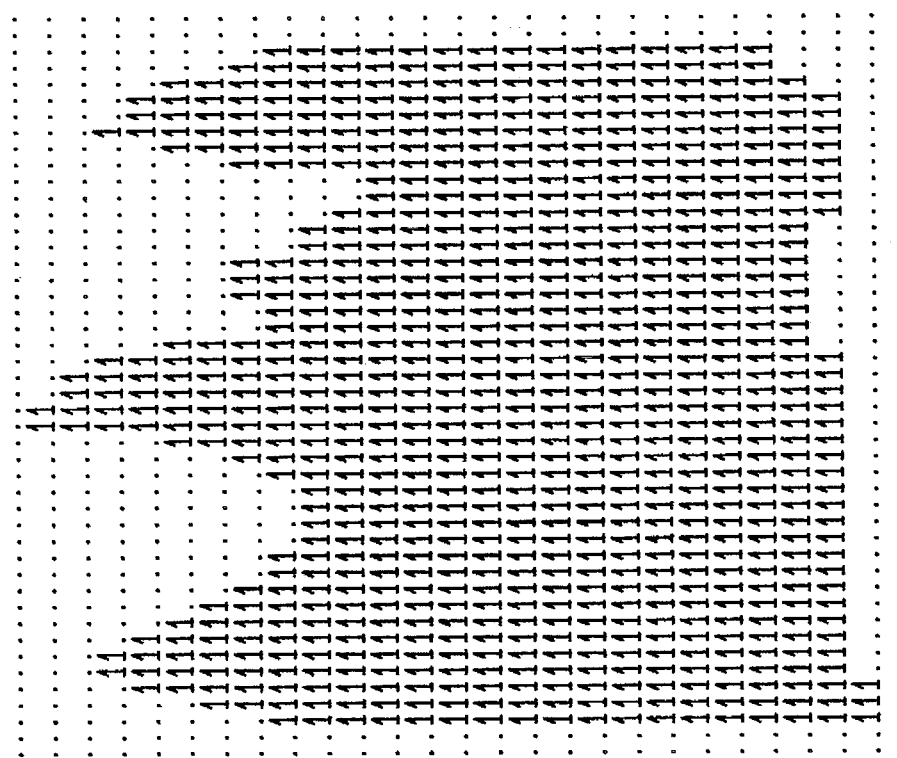
Figure 11B:
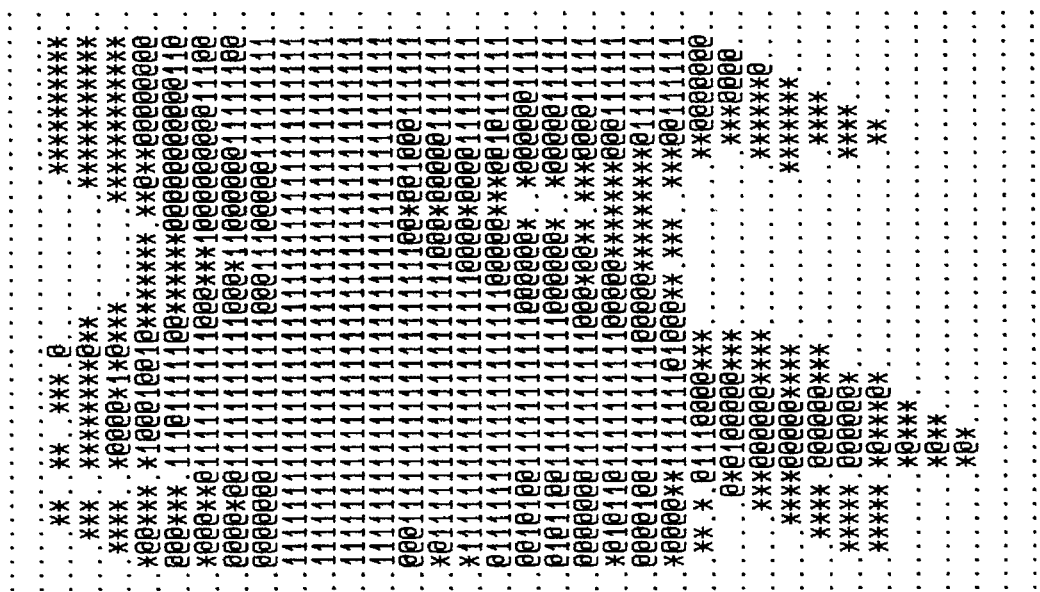
Figure 11A:
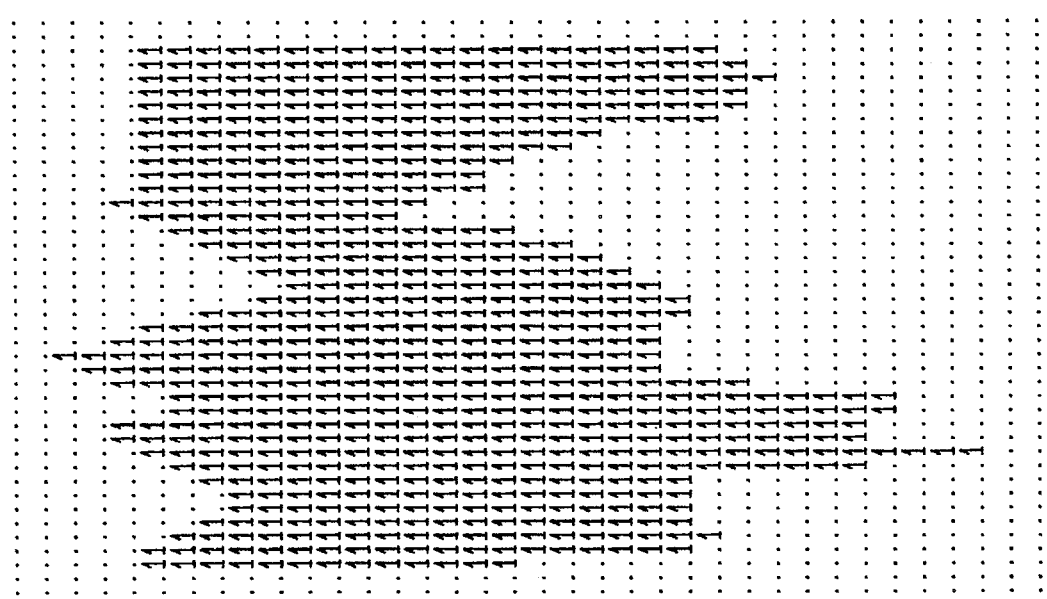

Several simulated crystal cross sections were generated, and are shown in FIGS. 9A, 10A, and 11A. Each dot represents a vacant lattice site, and each "1" represents an occupied site. Line counts were taken, by drawing rays R through the simulated cross sections, and counting the atoms which each ray crosses. Using the line counts, a system of equations was generated, analogous to those found from FIG. 7, and applied the linear programming techniques described above to the equations. The resulting phantoms are shown, respectively, in FIGS. 9B, 10B, and 11B, and labeled "Reconstruction."

In FIG. 9B, a "1" indicates a solution of value ONE. A dot indicates a solution value of ZERO.

In FIG. 10B, a "1" indicates a solution of value ONE. A dot indicates a solution value of ZERO. An asterisk (*) indicates a value between ZERO and ONE.

In FIG. 11B, a "1" indicates a solution of value ONE. A dot indicates a solution value of ZERO. An asterisk (*) indicates a value between ZERO and 0.5. An "at-sign" (@) indicates a value between 0.5 and 1.0.

One form of the invention relies on the fact that obtaining line counts of the small crystal samples described above is known in the art. Consequently, in principle, a crystal sample can be shipped to a laboratory equipped to perform line counts, and the laboratory will return a set of data indicating the line counts.

A set of equations is created, based on the data, and solved, using linear programming techniques, as described above. The variables of the equations may be restricted to values of zero and unity in the solution, or may be allowed to range continuously from zero to unity. (Commonly, linear programming software packages ask the user to specify the restrictions on the variables.) The values of the variable obtained are taken as indicating probabilities of occupancy of the respective lattice sites.

Additional Considerations

1. The PLOT 42 of FIG. 5 is a generalization. The PLOT 42 indicates that each atom attenuates the ELECTRON BEAM by a constant amount, namely DELTA. However, another case should be considered, namely, that where each atom attenuates the BEAM by a fraction of the BEAM's intensity (rather than by subtracting a fixed DELTA).

In such a case, $$\text{Intensity}_{out} = (\text{fraction})(\text{Intensity}_{in}) \quad (3)$$

wherein

Intensity$_{out}$ refers to the intensity of the BEAM after encountering the atom, and Intensity$_{in}$ refers to the intensity of the incoming BEAM. An equivalent statement of this equation is:

$$dI/dx = -(\text{fraction})(\text{Intensity at x}) \quad (4)$$

wherein dI/dx is the rate of change of intensity, I, at x, the atom's location

"fraction" is the fractional change in intensity, and

"Intensity at x" is the function describing the intensity, commonly written I(x).

Figure 1A:
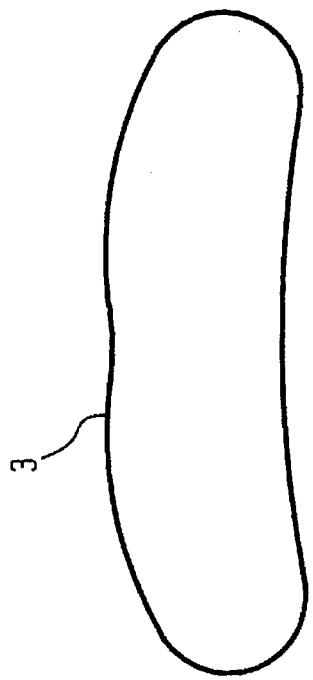
FIGS. 1A, 1B, and 1C illustrates principles of tomography.
Figure 1B:
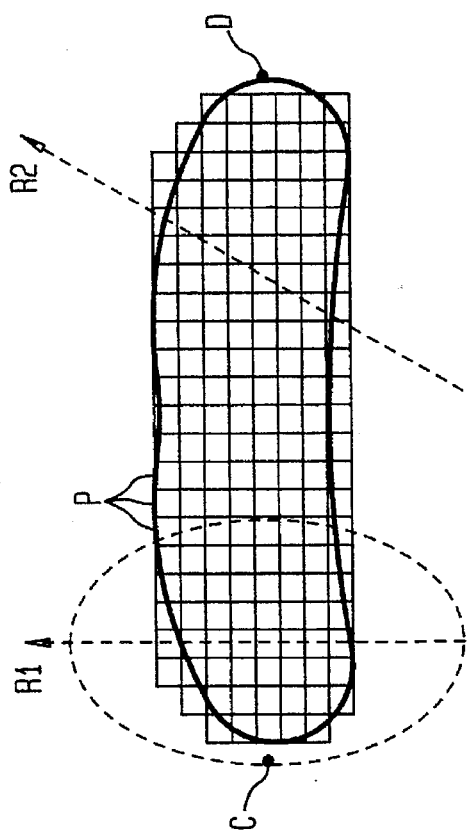
Figure 1C:
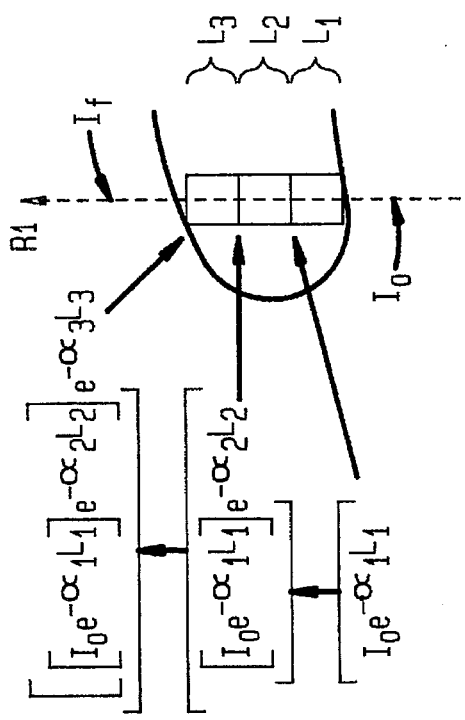

One solution to Equation (4) is $$I(x) = I_{in} e^{-(\text{fraction})(x)} \quad (5)$$

which describes exponential decay. The term "fraction" corresponds to an attenuation coefficient, $\alpha$, shown in FIG. 1C.

Figure 12:
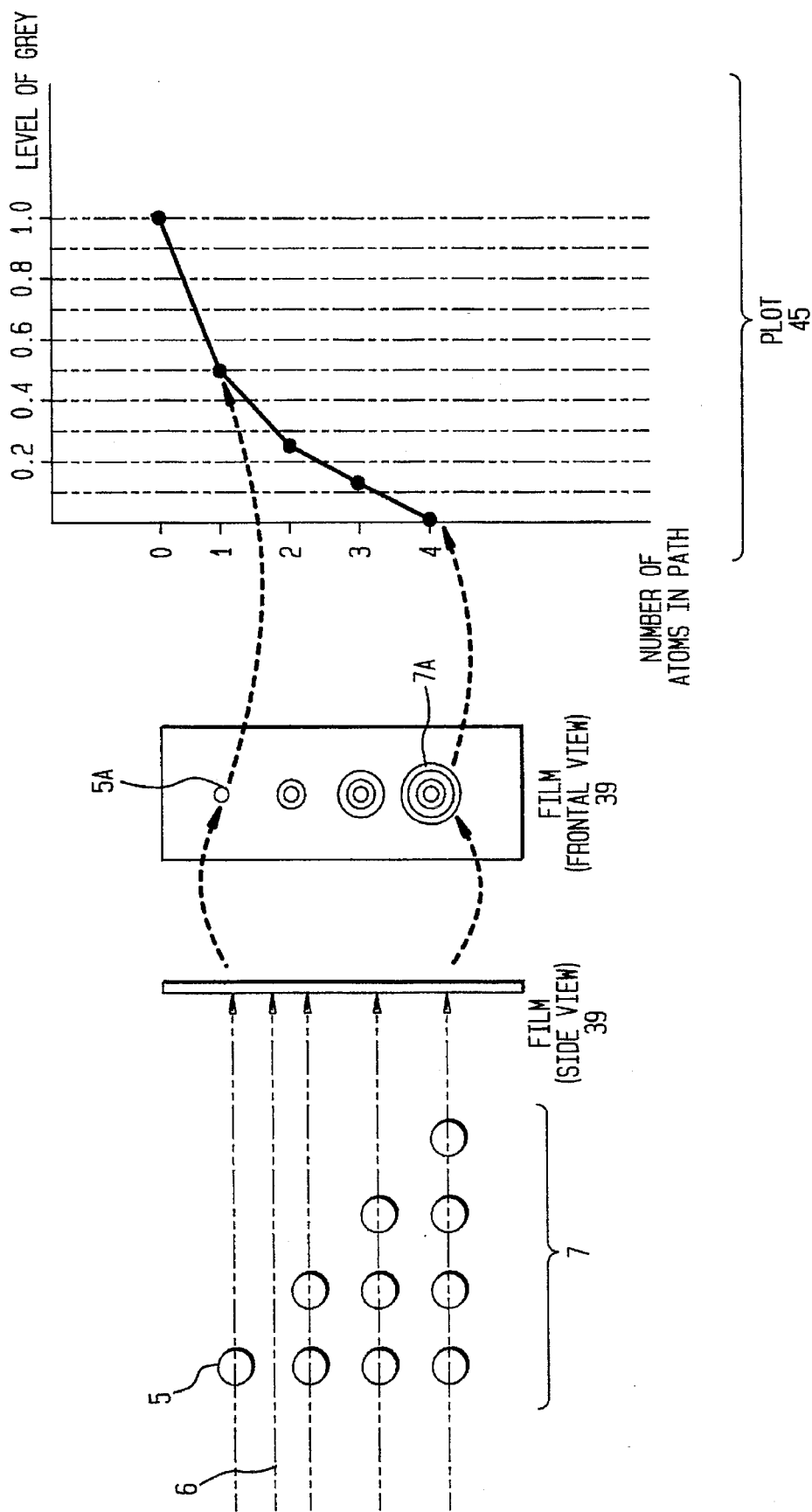
FIG. 12 illustrates exponential attenuation, for the purpose of explaining linearization of the attenuation.

FIG. 12 illustrates such exponential decay, when the "fraction" equals 0.5. If incoming intensity is $I_{in}$, then After encountering a single atom, the intensity is $I_{in}(0.5)$;

After encountering two atoms, the intensity is $I_{in}(0.5)(0.5)$, or $(0.25)I_{in}$;

After encountering three atoms, the intensity is $I_{in}(0.5)(0.5)(0.5)$, or $(0.125)I_{in}$; and After encountering four atoms, the intensity is $I_{in}(0.5)(0.5)(0.5)(0.5)$, or $(0.0625)I_{in}$.

Even though the PLOT 45 of FIG. 12 is exponential, it can be linearized by taking the logarithm, thereby justifying the remark, made earlier, that linear plots would be considered herein, without loss of generalization.

After the system of linearized equations is solved, each value of "x" is then raised to the power of the logarithm's base, to find the actual value of "x."

Under some conditions, exponential decay can appear as linear decay, especially in the presence of noise. For example, if the term "fraction" in Equation (3) is very small, then the plot of the function takes the form of a gentle curve. A gentle curve resembles a straight line over large spans. Noise, in effect, makes the plot jagged. It is difficult to distinguish a jagged gentle curve from a jagged straight line, thereby making it difficult to ascertain whether the underlying function indicated by the plot is actually a gently curve, or a straight line.

Therefore, in one form of the invention, the data indicated in the PLOT 42 of FIG. 6 is linearized, if necessary, before use.

2. The invention is advantageously used to provide plausible candidates of occupancy patterns, as by providing multiple solutions, rather than the single "most interior point" solution. A crystallographer, solid-state physicist, or other investigator will then examine the candidates, and choose the most suitable.

3. A distinction should be drawn between the present invention and another technique which analyzes small samples, namely, X-ray crystallography. One difference lies in the medium projected through the sample. In X-ray crystallography, photons, of X-ray frequency, are used. In the invention, electrons are used, which have different properties from photons.

Another difference lies in the basic assumptions used, and computations made. In X-ray crystallography, it is assumed that incoming X-rays act as plane waves, and that sheets of atoms collectively act as reflectors. Each sheet reflects a percentage of each incoming wavefront. The reflected wavefronts form an interference pattern, which is then detected externally, and, from it, the orientation of the atom-sheets is inferred.

But in X-ray crystallography, individual atoms are not detected. Only the collective behavior of sheets of atoms is detected. If a few atoms are missing from a sheet, their absence produces no significant change in results.

4. Sometimes, the most interior point solution provides a solution containing ZEROes and ONEs exclusively, with no fractional values. It can be proven that, in such a case, the solution is unique, and that no others exist.

5. Fractional solutions (eg, a value of "$x_{22}$" of 0.75) are taken as indicating probabilities, or likelihoods, of occupancy. The fraction 0.5 indicates maximal uncertainty, since it is mid-way between certain occupancy (indicated by ONE), and certain absence (indicated by ZERO).

6. Samples of size 100×100, in cross section, have been discussed in connection with an illustrative embodiment. However, use of the invention is not restricted to such sizes. Samples ranging from 25×25 to 1,000×1,000, and all combinations inbetween, can be used.

Further, the invention can be extended to three-dimensional situations, ranging in size from

25×25×25 to 1,000×1,000×1,000 atoms.

Restated in different terms, there is no necessity that the line counts be taken in a single plane of the object under investigation. Line counts can be taken in multiple planes. For example, in a cube of 25×25×25 atoms, line counts can be taken along planes parallel to the six faces. Also, line counts can be taken along planes parallel to diagonal planes.

In a preferred three-dimensional implementation of the invention, there are four main directions: (1, 1, 1), (3, 3, 2), (3, 2, 3), and (2, 3, 3).

7. Photographic film was described illustratively as a detector. However, as explained above, the positioning procedure requires that the SAMPLE 30 be rotated in small increments, followed by an examination of the image produced on the DETECTOR 39, for each increment. This procedure rapidly consumes X-ray film, as well as time required to process it.

Another detector more suited to this procedure is described in the *Phys. Rev. Lett.* article, identified above, which eliminates the large consumption of X-ray film.

8. Since the inter-atomic spacing in crystals is in the range of a few Angstroms, the 100×100 SAMPLE 30 measures a few hundred Angstroms on a side. A few hundred Angstroms corresponds to a few microns. Such a SAMPLE 30 is considered to be microscopic, since details are difficult, if not impossible, to discern using the naked eye.

From another perspective, it is generally accepted that the lower limit of resolving power of the human eye is in the range of 0.1 millimeter. Objects below this limit are considered microscopic in dimension, while those above this dimension are considered macroscopic.

9. An illustrative application of the invention is seen in evaluation of the internal structure of semiconductors, wherein occupancy of lattice sites is desired to be known, but applications are not limited to such evaluations.

10. One feature of the embodiment of the invention explained in FIG. 7 is that a small number of equations was derived. In contrast, normal tomography uses hundreds of sets of equations.

Different forms of the invention contemplate using integral numbers of sets of equations (or line counts), ranging from three sets to twenty sets. More than twenty sets of equations is, in general, not preferred.

However, the preference for fewer than twenty sets of equations is presently based on two primary factors: (1) the technical effort required in obtaining more than twenty line counts and (2) the computational effort required to solve more than twenty sets of equations. If advancements in technology make it practical of obtain more than twenty line counts in an efficient manner, or reduce the computational effort, or both, then the preference for fewer than twenty sets of equations no longer will exist.

As a consequence, two-dimensional samples of size exceeding 1,000×1,000, and three-dimensional samples of size exceeding 1,000×1,000×1,000 atoms can be analyzed.

11. In both the invention, and in prior-art tomography, a flux can be said to pass through the object of investigation. In prior-art tomography, the flux is electromagnetic radiation, for example. Under the invention, the flux is advantageously chosen as an electron beam.

12. It should be observed that the measured spot intensities, such as those illustrated in FIG. 7, will, in general, contain noise, due to random thermal motion of electrons. Thus, the spot intensities do not perfectly indicate the numbers of atoms within the columns. This is a source of error.

Further, noise, and other factors, can cause the equations, discussed above, to be internally inconsistent, and thus lacking a solution. In such a case, the equations can be replaced by inequalities of the following form:

$$L - r \leftarrow \text{sum} \leftarrow L + r,$$

wherein

"L" is the measured line count, "sum" is a sum of unknowns (e.g., $x_{11} + x_{22} \ldots$), "$\leftarrow$" means "less than or equal to," and "r" is an index.

The index "r" is progressively assigned ascending values, such as 1, 2, 3, etc., until a solution is found to the inequalities.

Many linear programming techniques solve both equality-type and inequality-type equations using such a procedure, so that no added burden is placed on the user by specifying inequalities derived from noisy data, rather than equalities derived from clean data.

13. The following four components can form the basic structure of a means for deriving a tomographic phantom:

1. A linear programming (LP) software package;
2. A compatible computer on which the LP software can run;
3. A data-entry device, such as a keyboard, or a data reader, for entering line count data into the LP software; and
4. A mapping program which spatially maps the solutions produced by the LP software.

The mapping program can be extremely simple in its logic. The mapping program reads the output of the LP software. (For a 100×100 cross-section, the output is 10,000 variables.) The output is either (a) a collection of zeroes and ones, or (b) a collection of variables ranging from zero to one.

In the former case, the mapping program plots a dot, at the proper location, for each variable which equals one. The dot indicates an occupied lattice site.

In the latter case, for variables ranging from zero to one, the mapping program plots a dot, at the proper location, for every variable above a threshold. The user specifies the threshold. For example, if the threshold is 0.999, then dots will appear at lattice sites only when a very high probability is found. In contrast, is the threshold is 0.51, then many more lattice sites will be occupied.

The proper matrix position, for positioning each dot, is determined by the subscript of the variable, as indicated in FIG. 7 and the resulting Equations, given above.

Figure 13:
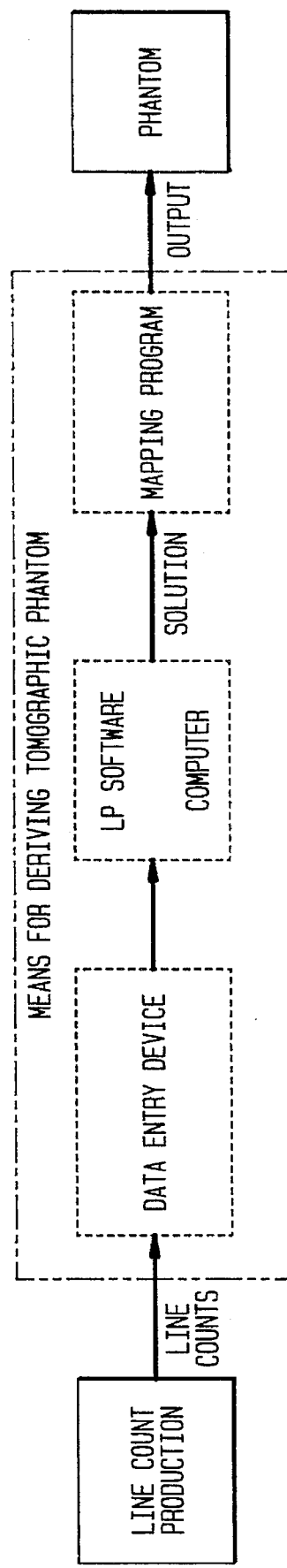
FIG. 13 is a block diagram of one form of the invention.

FIG. 13 is a block diagram of the system just described.

Numerous substitutions and modifications can be undertaken without departing from the true spirit and scope of the invention. What is desired to be secured by Letters Patent is the invention as defined in the following claims.

We claim:

1. A method of obtaining probabilities of occupancy of lattice sites in a sample, comprising the following steps:
    a) obtaining line count data; and
    b) obtaining probabilities of occupancy of the lattice sites from the line count data.

2. Method according to claim 1, in which the line count data are obtained from attenuation of an electron beam projected through the sample.

3. Method according to claim 1, in which the probabilities are obtained by linear programming techniques.

4. Method according to claim 1, in which the sample has a cross section smaller than 1,000×1,000 atoms.

5. A method of obtaining probabilities of occupancy of lattice sites by atoms in a material, comprising the following steps:
    a) obtaining line count data;
    b) deriving a system of equations from the line count data, which relate probabilities of occupancy to the line count data;
    c) finding a solution to the system; and
    d) based on the solution, assigning probabilities of occupancy to lattice sites.

6. Tomographic apparatus, comprising:
    a) means for producing line counts of atoms in a sample; and
    b) means for deriving a tomographic phantom, from the line counts.

7. Apparatus according to claim 6, in which the sample has a cross section of less than 1,000×1,000 atoms.

8. Apparatus according to claim 6, in which the means of paragraph (a) comprises a transmission electron microscope.

9. In tomography, an improvement comprising:
    a) transmitting an electron flux through a crystalline object;
    b) deriving line count data from the flux; and
    c) deriving an estimate of occupancy of lattice sites from the line count data.

10. Improvement according to claim 9, in which the crystalline object is smaller than 1,000×1,000 lattice sites in cross section.

11. In tomography, wherein a system of equations characterizing a sample is obtained, an improvement comprising:
    a) for variables in the system of equations, obtaining solutions in the continuous domain;
    b) converting the solutions into binary variables; and
    c) generating a phantom from the binary variables.

12. Improvement according to claim 11, in which the solutions lie in a predetermined range.

13. In tomography, an improvement for generating a phantom, comprising:
   a) performing line counts on a sample in which discrete lattice points are definable;
   b) deriving a system of equations from the line counts;
   c) obtaining a solution to the system, in which solution variables are continuous over a defined range; and
   d) graphically mapping lattice occupancy, based on the solution.

14. Improvement according to claim 13, in which the solution is obtained by linear programming techniques.

15. A method of estimating occupancy of lattice sites in a lattice, comprising the following steps:
   a) obtaining line counts of atoms;
   b) deriving a system of equations from the line counts;
   c) obtaining a solution of the system, in which variables are constrained to a predetermined range;
   d) establishing a threshold; and
   e) in a graph, indicating lattice points where the variables exceed the threshold.

16. A method of analyzing a crystalline body, comprising the following steps:
   a) repeatedly projecting an electron beam through a body, at angles which produce discernible images on an electron detector;
   b) from the discernible images, deriving line counts of atoms;
   c) from the line counts, deriving a set of equations containing variables;
   d) finding a solution to the equations using linear programming techniques; and
   e) assigning probabilities of occupancy to lattice sites, based on said solution.

17. Method according to claim 16, in which the crystalline body is of cross-section having less than $1,000 \times 1,000$ atoms.

* * * * *